(12) United States Patent
Maurer et al.

(10) Patent No.: US 11,533,061 B2
(45) Date of Patent: Dec. 20, 2022

(54) CIRCUITRY INCLUDING AT LEAST A DELTA-SIGMA MODULATOR AND A SAMPLE-AND-HOLD ELEMENT

(71) Applicant: Hahn-Schickard-Gesellschaft für angewandte Forschung e.V., Villingen-Schwenningen (DE)

(72) Inventors: Michael Maurer, Rheinhausen (DE); Markus Kuderer, Kirchzarten (DE); Armin Taschwer, Kientzheim (FR)

(73) Assignee: Hahn-Schickard-Gesellschaft für angewandte Forschung e.V.

( * ) Notice: Subject to any disclaimer, the term of this patent is extended or adjusted under 35 U.S.C. 154(b) by 0 days.

(21) Appl. No.: 17/338,955

(22) Filed: Jun. 4, 2021

(65) Prior Publication Data

US 2021/0297089 A1 Sep. 23, 2021

Related U.S. Application Data

(63) Continuation of application No. PCT/EP2019/083535, filed on Dec. 3, 2019.

(30) Foreign Application Priority Data

Dec. 7, 2018 (DE) .......................... 102018221184.1

(51) Int. Cl.
*H03M 3/00* (2006.01)
(52) U.S. Cl.
CPC ........... *H03M 3/494* (2013.01); *H03M 3/438* (2013.01)
(58) Field of Classification Search
CPC .......... H03M 3/494; H03M 3/38; H03M 3/39; H03M 3/43; H03M 3/458
See application file for complete search history.

(56) References Cited

U.S. PATENT DOCUMENTS 9,077,373 B1 * 7/2015 Nezuka ................. H03M 3/398
10,615,818 B1 * 4/2020 Singh .................... H03M 3/496
(Continued)

FOREIGN PATENT DOCUMENTS

EP 3182597 6/2017
EP 3182597 A1 6/2017
(Continued)

OTHER PUBLICATIONS

János Márkus, Jose Silva, Gabor C. Temes, Theory and Application of Incremental DS Converters, 2004.
(Continued)

*Primary Examiner* — Lam T Mai
(74) *Attorney, Agent, or Firm* — Haynes and Boone, LLP

(57) ABSTRACT

A circuitry for an incremental delta-sigma modulator includes at least an incremental delta-sigma modulator and a sample-and-hold element, the sample-and-hold element being arranged in front of the incremental delta-sigma modulator and providing an input voltage for the incremental delta-sigma modulator in the charged state, wherein the sample-and-hold element includes a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element. In addition, a method of operating a circuitry for an incremental delta-sigma modulator is proposed.

11 Claims, 8 Drawing Sheets

(56) References Cited

U.S. PATENT DOCUMENTS

| | | | |
|---|---|---|---|
| 10,868,564 B1* | 12/2020 | Kanematsu | H03M 3/438 |
| 2014/0372074 A1 | 12/2014 | Dribinsky et al. | |
| 2016/0197619 A1* | 7/2016 | Katayama | H03M 3/496 |
| | | | 341/143 |
| 2019/0268014 A1* | 8/2019 | Pernull | H03M 1/128 |

FOREIGN PATENT DOCUMENTS

| | | |
|---|---|---|
| JP | 2018133630 | 8/2018 |
| JP | 2018133630 A | 8/2018 |
| KR | 10 1276439 B1 | 6/2013 |

OTHER PUBLICATIONS

R. Schreier, G. C. Temes, Understanding delta-sigma data converters, 2005.

Kang, E. G. et al.: Design of Low Power Sigma-delta ADC for USN/RFID Reader. In: Journal of the Korean Institute of Electrical and Electronic Material Engineers, vol. 19, No. 9, Sep. 2006, pp. 800-807.

International Search Report and Written Opinion dated Feb. 19, 2020 issued in PCT Patent App. No. PCT/EP2019/083535 (13 pages with English translation).

International Preliminary Report on Patentability dated Mar. 18, 2021 issued in PCT Patent App. No. PCT/EP2019/083535 (6 pages).

* cited by examiner

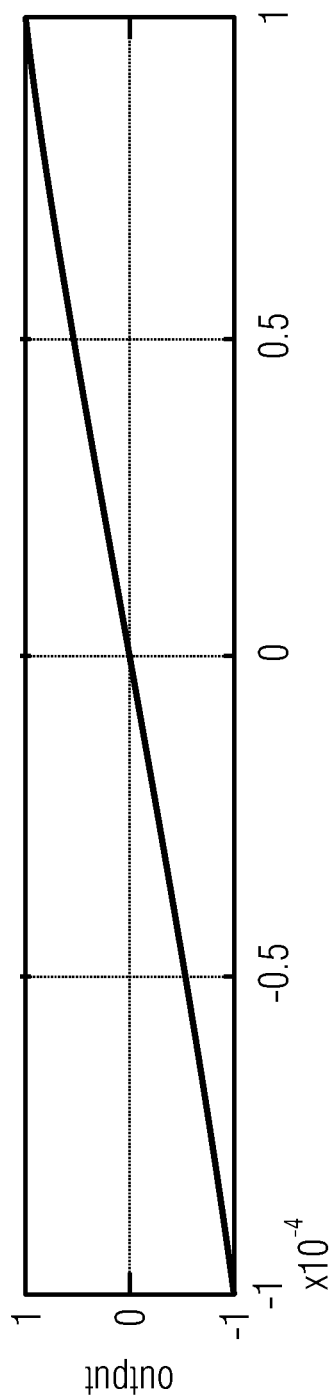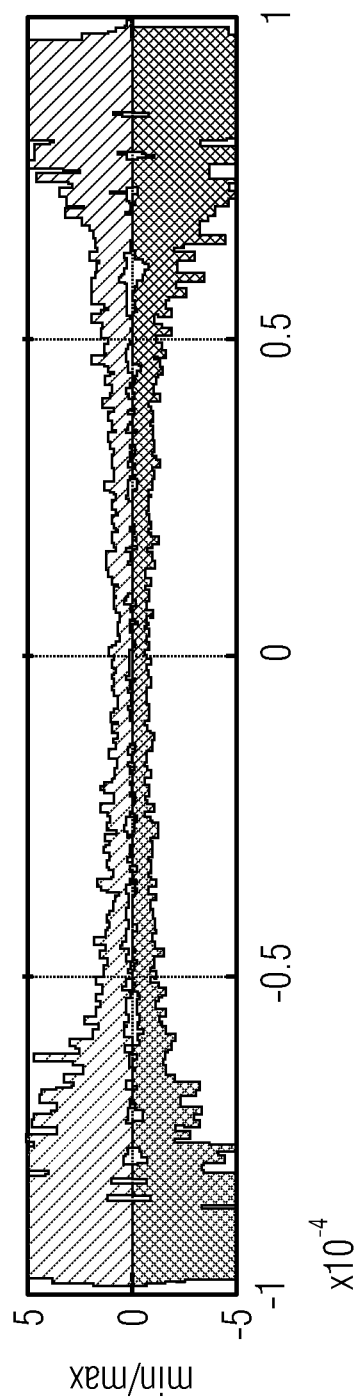

CIRCUITRY INCLUDING AT LEAST A DELTA-SIGMA MODULATOR AND A SAMPLE-AND-HOLD ELEMENT

CROSS-REFERENCES TO RELATED APPLICATIONS

This application is a continuation of copending International Application No. PCT/EP2019/083535, filed Dec. 3, 2019, which is incorporated herein by reference in its entirety, and additionally claims priority from German Application No. DE 10 2018 221 184.1, filed Dec. 7, 2018, which is incorporated herein by reference in its entirety.

The present invention relates to a circuitry including at least a delta-sigma modulator and a sample-and-hold element as well as to a method of operating a circuitry including at least a delta-sigma modulator and a sample-and-hold element.

BACKGROUND OF THE INVENTION

Incremental delta-sigma modulators (IDSMs) are modified versions of delta-sigma modulators (DSMs) wherein no continuous AD conversion takes place. An IDSM is reset after every AD conversion. Resetting of the integrators is performed, e. g., by a switch located above the integration capacitances, as shown in FIG. 1. Resetting the IDSM enables multiplexing operation, wherein analog signals from various input sources are converted to the digital domain by means of an IDSM. With a classic DSM, multiplexing is not possible. It is known that both single-bit and multi-bit implementations are possible for the DSM.

With an IDSM, there are two places where "sampling" takes place, namely at the comparator within the IDSM and/or at the sample-and-hold element, which is also referred to as an S&H stage. With a sampling clock of a single bit of the comparator of a known delta-sigma modulator, one bit is transferred from the comparator to the decimation filter in each case. Accordingly, with a sampling clock of the comparator, with a multi-bit implementation of the DSM, wherein multi-bit comparators are present accordingly, the multi bits are transferred from the comparators to the decimation filter. A sampling clock of the S&H stage (as with ADCs), is defined as a clock at which new voltage values are stored. A sampling clock also corresponds to the clock at which usable digital values, namely the voltage values converted to digital, are available at the output of the decimation filter. An AD conversion takes an S&H sampling clock, but several comparator sampling clocks, and converts one sampled voltage value to digital at a time.

What serves as an input stage for the IDSM is typically a sample-and-hold element (also referred to as a sample&hold (S&H stage), wherein the input voltage to be converted is stored on a capacitance and is connected to the input of the IDSM by means of an active amplifier, or an impedance converter (active buffer). The buffer here serves to prevent the stored input voltage from being influenced by the input resistors. Alternatively, the storage capacitance may be dispensed with. The input voltage will then be applied to the buffer during the entire AD conversion.

A typical disadvantage of DSMs and also of IDSMs is that when an input signal is present in the vicinity of the so-called "full-scale" value, i.e. when the maximum possible reset voltage is present, increased noise occurs in the digital output signal. This results in that with high input signals, a clear increase in variance occurs. The variance indicates the fluctuation of the output value in various AD conversions with a same input value of the input voltage. This is problematic, in particular, when a signal and an associated reference signal are to be converted (double sampling) and when the reference signal is present in the vicinity of a full-scale signal. The actual signal in this case is typically permanently related to the reference signal in either a positive or negative manner (unipolar measurement). In this case, the overall noise of the calculated final value would typically be dominated by the noise of the reference value, even if the signal is present within the medium range of the IDSM and if it were possible to achieve a small noise contribution there.

Consequently, a large range of the input signal range (approx. 40-50%) of the delta-sigma modulator cannot be employed in a useful manner due to the large amount of noise.

SUMMARY

According to an embodiment, a circuitry for an incremental delta-sigma modulator may have at least an incremental delta-sigma modulator and a sample-and-hold element, the sample-and-hold element being arranged in front of the incremental delta-sigma modulator and providing an input voltage for the incremental delta-sigma modulator in the charged state, wherein the sample-and-hold element includes a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element.

Another embodiment may have a method of operating a circuitry including at least an incremental delta-sigma modulator and a, in particular passive, sample-and-hold element, wherein the sample-and-hold element is arranged in front of an input of the incremental delta-sigma modulator; in particular, the circuitry being configured for an incremental delta-sigma modulator, the circuitry may have at least an incremental delta-sigma modulator and a sample-and-hold element, the sample-and-hold element being arranged in front of the incremental delta-sigma modulator and providing an input voltage for the incremental delta-sigma modulator in the charged state, wherein the sample-and-hold element includes a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element, which method may have the steps of:
  providing an input voltage at the incremental delta-sigma modulator, in particular by the capacitor of the sample-and-hold element,
  using an input voltage decreasing in amount so as to ensure random behavior of an output bitstream, wherein the capacitor is charged during a resetting phase of the delta-sigma modulator and is connected to the delta-sigma modulator during a conversion.

In accordance with the invention, a circuitry for an incremental delta-sigma modulator is proposed. The circuitry includes at least an incremental delta-sigma modulator and a, in particular passive, sample-and-hold element, the sample-and-hold element being arranged in front of the incremental delta-sigma modulator and providing an input voltage for the incremental delta-sigma modulator in the charged state, wherein the sample-and-hold element comprises a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element. The passive sample-and-hold element is characterized in that it includes no active amplifier. Rather, the passive sample-and-hold element comprises merely a capacitor arranged between two switches. With the passive sample-and-hold element, the two switches (the first switch and the second switch) are switched such that at a point in time, either the first switch is closed and the second switch is open, or the second switch is closed and the first switch is open. The passive sample-and-hold element is used, according to the proposal, with an incremental delta-sigma modulator. Known DSMs are typically operated entirely without any sample-and-hold elements (S&H stages). Generally, it is feasible to use the passive sample-and-hold element with an analog-to-digital converter. In this case, both switches will be open to avoid dead times during switching. According to the proposal, the timing is such that the capacitor is being charged while the integrator capacitances of the IDSM are reset. In this manner, dead times can be avoided. Alternatively, it is also possible to use several S&H stages with one IDSM, in which case only one S&H stage is connected, with its second switch, to the IDSM. In this case, "charging times" would be possible independently of resetting the IDSM. In this manner, too, dead times can be avoided.

Advantageously, the capacitor is configured such that a time constant for discharging the capacitor of the sample-and-hold element corresponds to an AD conversion. In particular, an AD conversion is indicated as a number of bits/clock frequency, the clock frequency being a clock frequency of the comparator. It is further feasible for the time constant for discharging the capacitor of the sample-and-hold element to be larger or smaller than a time period taken for an AD conversion. In particular, the time constant is indicated by the capacitance of the capacitor of the sample-and-hold element and by an input resistance present at the IDSM. This has the advantage that a large range of the input signal range of the incremental delta-sigma modulator may be employed in a useful manner. In particular, the variance of the incremental delta-sigma modulator within the input range—in particular in the vicinity of the maximum input signals—is considerably smaller as compared to incremental delta-sigma modulators known from conventional technology.

Advantageously, charging of the capacitor is provided during resetting of the IDSM; in particular, the capacitor of the sample-and-hold element exhibits as small a time constant as possible for charging the capacitor. Alternatively, one may also envisage several S&H stages in multiplexing operation during charging. Advantageously, a time constant for discharging the capacitor corresponds to a time duration longer or shorter than the time duration of an AD conversion. Particularly advantageously, discharging of the capacitor in the IDSM is effected with a time constant of an AD conversion. Here, the time constant is defined by the capacitance C of the S&H stage and by the input resistor R of the IDSM. The duration of an AD conversion depends on the system specifications. For example, the duration of an AD conversion may be around 1 µs, and the sampling clock of the comparator may amount to 100 MHz. Here, therefore, less than 100 bits of the comparator are transferred to the decimation filter for each AD conversion. I.e., less than 100 bits are transferred since several clocks may be used for resetting and other control tasks.

Further advantageously, the incremental delta-sigma modulator is resettable after each AD conversion. Because the incremental delta-sigma modulator is resettable, an oscillation influence from a previous AD conversion on a subsequent AD conversion can be avoided. Each AD conversion may thus be considered independently of any previous AD conversion.

In accordance with an advantageous embodiment, the incremental delta-sigma modulator is an $n^{th}$-order modulator, wherein n is a natural number, in particular, n=1, 2, 3, 4, 5, or 6. The order of the incremental delta-sigma modulator is dependent on the specifications of the modulator. In particular, the order of the delta-sigma modulator is determined by the number of integrators. In principle, it is possible, with a higher order, to achieve more accurate AD conversions with the same number of comparator clocks used, or it is possible to achieve the same level of accuracy with fewer comparator clocks, whereby a faster modulator is provided. With higher orders, however, the modulator becomes more complex; in particular, the modulator will then exhibit a larger spatial expansion. The order of the incremental delta-sigma modulator therefore is a tradeoff between accuracy and/or speed, and complexity and/or size.

Advantageously, the sample-and-hold element is integrated in the incremental delta-sigma modulator or may be externally connected to the implemented delta-sigma modulator. Particularly advantageously, the sample-and-hold element and the incremental delta-sigma modulator are arranged on a chip, in particular with other components.

Further advantageously, the incremental delta-sigma modulator includes a decimation filter, in particular at its output. Particularly advantageously, the decimation filter includes a lossy integrator. When using a lossy integrator, weighting of output bits in the decimation filter may be adapted because of the decrease of the input voltage in terms of amount.

Advantageously, the output bits at the end of an AD conversion exhibit a valency that is increased as compared to the weighting performed with a static input, i.e. constant, voltage present at the incremental delta-sigma modulator. Within this context, an AD conversion includes, e. g., less than 100 comparator clocks (i.e. <100 bits).

For adapting weighting, an integrator, in particular a digital integrator, of the decimation filter of the incremental delta-sigma modulator is replaced by a so-called, in particular digital, lossy integrator, wherein, in particular, an edge frequency $f_C=1/(2\pi RC)$ is defined by a time constant constituted by the input resistor R of the incremental delta-sigma modulator and by the capacitance C of the capacitor of the, in particular passive, sample-and-hold element. With an ideal integrator, amplification is not limited. A constant input value≠0 would therefore (after an infinite amount of time) result in an infinitely large output value. However, with a lossy integrator, amplification is limited. This results in that the lossy integrator behaves as an integrator in the event of high input frequencies being present (integrator behavior) and behaves as an amplifier in the event of low frequencies being present (low-pass behavior). The transition between the integrator behavior and the low-pass behavior is defined by the edge frequency.

A further aspect of the present invention relates to a method of operating a circuitry for an incremental delta-sigma modulator. The circuitry includes at least an incremental delta-sigma modulator and a sample-and-hold element, wherein the, in particular passive, sample-and-hold element is arranged in front of an input of the incremental delta-sigma modulator; in particular, the circuitry is configured as was already described, wherein the method includes the following steps:

providing an input voltage at the incremental delta-sigma modulator, in particular by the capacitor of the sample-and-hold element, using an input voltage decreasing in amount so as to ensure random behavior of an output bitstream, wherein the capacitor is charged during a resetting phase of the delta-sigma modulator and is connected to the delta-sigma modulator during a conversion.

In the method proposed, a passive sample-and-hold element is used wherein the input voltage present changes, in particular decreases in amount over time. As long as an input voltage is transferred to the IDSM, charging of the sampling capacitor of the sample-and-hold element is ruled out. This is achieved in that the first switch is open while the second switch is closed (first switching state). However, as soon as the sampling capacitor is being charged, i.e. the first switch is closed, the second switch is opened (second switching state) so as to avoid that the incremental delta-sigma modulator is supplied with an input voltage. The capacitor of the sample-and-hold element is also referred to as a sampling capacitor. A dead time and/or a switching time between both switching states of the first and second switches lies within the range of a comparator clock and is therefore to be neglected. Said switching time may be readily implemented, in particular, via controlling the sequence. Shorter or longer switching times are also feasible, however. The switching times are non-critical if the resistances of the opened switches are large enough so that the capacitor does not discharge (too much).

Advantageously, the capacitor of the sample-and-hold element is selected such that a time constant taken for discharging the capacitor of the sample-and-hold element corresponds to a time duration of an AD conversion. In particular, an AD conversion is indicated as a number of bits/clock frequency, the clock frequency being that of the comparator. In particular, the time constant is indicated by the capacitance of the capacitor of the sample-and-hold element and by an input resistance present at the IDSM. This has the advantage that a large range of the input signal range of the incremental delta-sigma modulator may be employed in a useful manner. In particular, the variance of the incremental delta-sigma modulator within the input range—in particular in the vicinity of the maximum input signals—is considerably smaller as compared to incremental delta-sigma modulators known from conventional technology. Advantageously, charging of the capacitor is provided during resetting of the IDSM, i.e. is envisaged with as small a time constant as possible for charging the capacitor. Alternatively, one may also envisage several S&H stages in multiplexing operation during charging. Further advantageously, discharging of the capacitor in the IDSM is envisaged with a time constant of an AD conversion or with a time constant larger or smaller than a time duration of an AD conversion. Here, the time constant is defined by the capacitance C of the S&H stage and by the input resistor R of the IDSM. The duration of an AD conversion depends on the system specifications. For example, the duration of an AD conversion may be around 1 µs, and the sampling clock of the comparator may amount to 100 MHz. Here, therefore, less than 100 bits of the comparator are transferred to the decimation filter for each AD conversion. I.e., less than 100 bits are transferred since several clocks may be used for resetting and other control tasks.

Further advantageously, weighting of the output bits is adapted by means of a decimation filter; in particular, a valency that is increased as compared to weighting performed in the event of a constant input voltage is assigned to the output bits at the end of an AD conversion. If the input voltage has decreased, due to the discharge, to about 90% of the maximum input voltage, the valency of said comparator bit is increased to $1/90\%$ (as compared to the first bit generated, when the capacitor still was charged to 100% of the sampled voltage).

For adapting weighting, an integrator of the decimation filter is replaced by a so-called lossy integrator, wherein, in particular, an edge frequency $f_C=1/(2\pi RC)$ is defined by a time constant constituted by the input resistor R and by the capacitor C. Due to the lossy integrator, said weighting is achieved in that the weighting of the bits which are processed first is reduced by the decaying impulse response of the lossy integrator.

Advantageously, a digital output value is calculated as a weighted sum of the output bitstream. Weighting of the bits here is defined by the impulse response of the (digital) decimation filter. The bit generated most recently is weighted with the first value of the impulse response, the second most recent bit is weighted with the second value, etc.

An essential aspect of the present invention may be seen in that a passive sample-and-hold stage, or a passive sample-and-hold element, is used for supplying an incremental delta-sigma modulator with an input voltage which decreases in amount over time. It is feasible to apply the present invention to a delta-sigma modulator as well.

BRIEF DESCRIPTION OF THE DRAWINGS

Embodiments of the present invention will be detailed subsequently referring to the appended drawings, in which:

FIGS. 3a and 3b shows an output signal and a variance with different input signals while using an active sample-and-hold stage known from conventional technology.

DETAILED DESCRIPTION OF THE INVENTION

Figure 1:
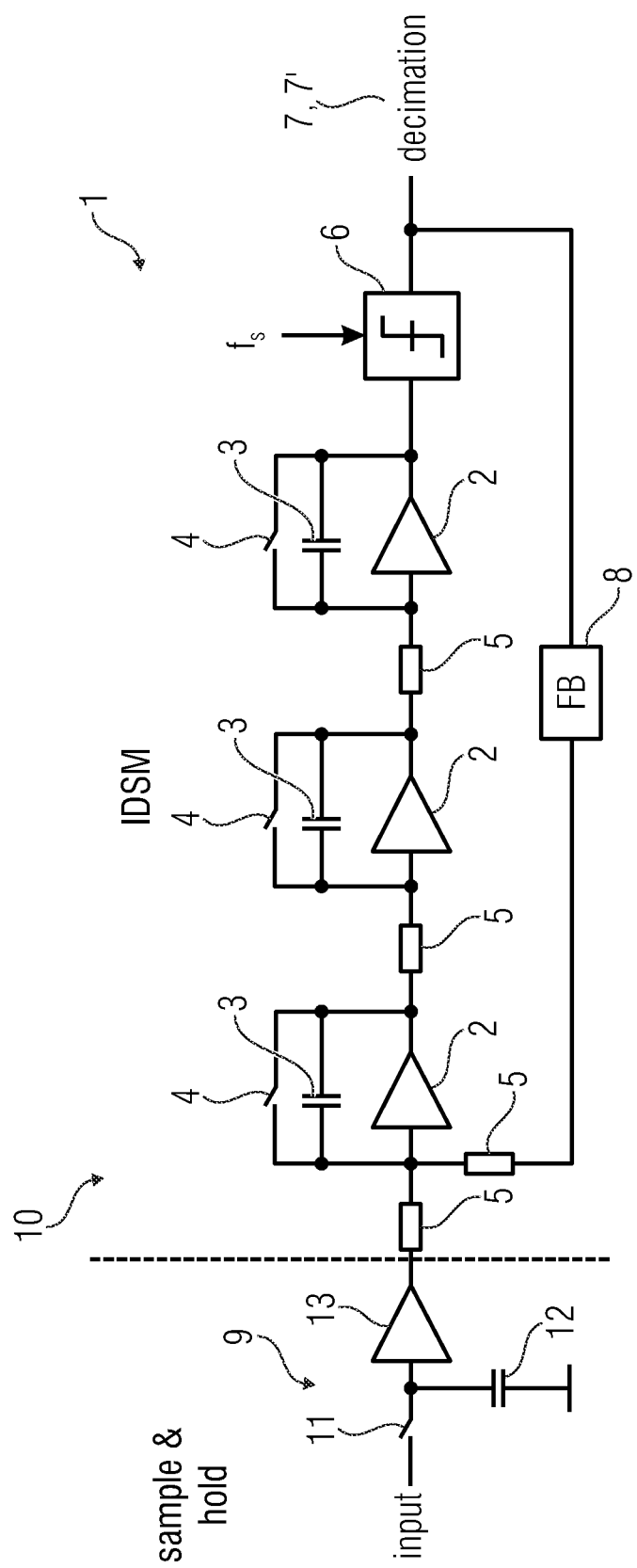
FIG. 1 shows a $3^{rd}$-order IDSM having an active sample-and-hold stage.
Figure 4:
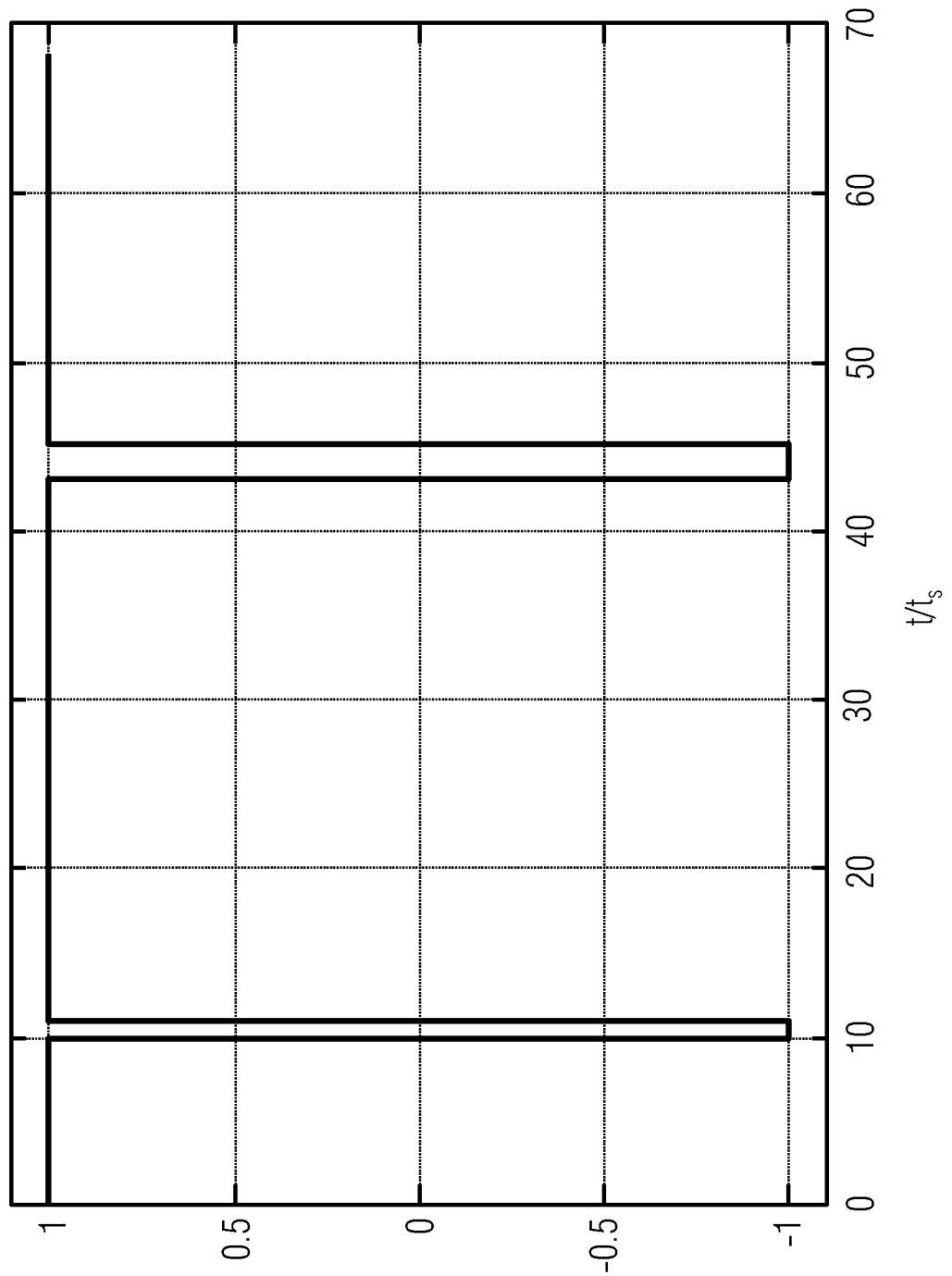
FIG. 4 shows a typical output bitstream with an input signal with 90% full scale (FS)

The present invention will be described below while combining FIGS. 1 to 9, wherein FIGS. 1, 3, and 4 show a circuitry known from conventional technology (FIG. 1) and its measurable output signal and/or its variance (FIGS. 3a, 3b) as well as a typical output bitstream (FIG. 4).

FIG. 1 shows an embodiment, known from conventional technology, of a circuitry 10 for an incremental delta-sigma modulator (IDSM) 1. The IDSM 1 includes, as shown in FIG. 1, three integrators 2, each of which comprises, in turn, a capacitor 3 and a switch 4. Following conversion of a sample, i.e. following an AD conversion, the integrators 2 are reset. To simplify matters, the IDSM has been drawn without the zeros that may be used for stability. The capacitor 3 of the integrator 2 serves as an analog memory wherein the input voltage $U_{on}$ is added over time. This results in integration over time t. Moreover, the IDSM includes, as is known and as does any DSM, input resistors 5 and a comparator 6. In addition, the IDSM includes a feedback component 8. In the simplest case, a feedback component 8 consists of two voltage sources providing a positive and a negative maximum signal, respectively. It is feasible, for example, to simply use GND and the supply voltage as a positive and negative maximum signal, respectively, and a controlled switch which applies some voltage to the resistor as a function of the output bit. With multi-bit implementations, a correspondingly larger number of different voltage levels is possible. A—in particular digital—filter 7, in particular a low-pass filter or an integrator, is arranged at the output of the IDSM. The circuitry 10 further includes a sample-and-hold element 9, which is connected upstream from the IDSM 1. The sample-and-hold element 9 provides an input voltage $U_{on}$ at the input of the IDSM 1. The sample-and-hold element 9 includes, as is known, a switch 11, a capacitor 12, and an active buffer 13, as a result of which a constant input voltage $U_{on}$ may be provided at the input of the IDSM 1. Within the context of the present application, a buffer is to be understood to mean an amplifier and/or an impedance converter.

The IDSM 1 is a modified form of a delta-sigma modulator, wherein no continuous AD conversion of the input voltage $U_{on}$ takes place. The IDSM 1 is, or can be, reset after each AD conversion. Within the context of sampling a voltage, a sample is to be understood to mean the instantaneous value of the voltage at the time of sampling. Said instantaneous value is then maintained on the capacitor during the S&H stage. In the example of FIG. 1 which is shown, resetting of the integrators is effected by the switches 4 located above the integration capacitances, or the capacitors 3. Resetting of the IDSM 1 enables multiplexing operation, wherein analog signals of various input sources are converted to the digital domain by means of an IDSM.

In a typical case, what will serve as an input stage for the IDSM 1 is a sample-and-hold element 9, which is also known as a sample-and-hold (S&H) stage, wherein the input voltage $U_{on}$ to be converted is stored on the capacitor 12 and is connected to the input of the IDSM 1 with the aid of the active buffer 13. The buffer 13 serves to ensure that the stored input voltage $U_{on}$ is not influenced by the input resistances. Alternatively, it is also possible to dispense with the storage capacitance, or the capacitor 12. The input voltage $U_{on}$ will then be applied to the buffer 13 during the AD conversion.

Figure 2:
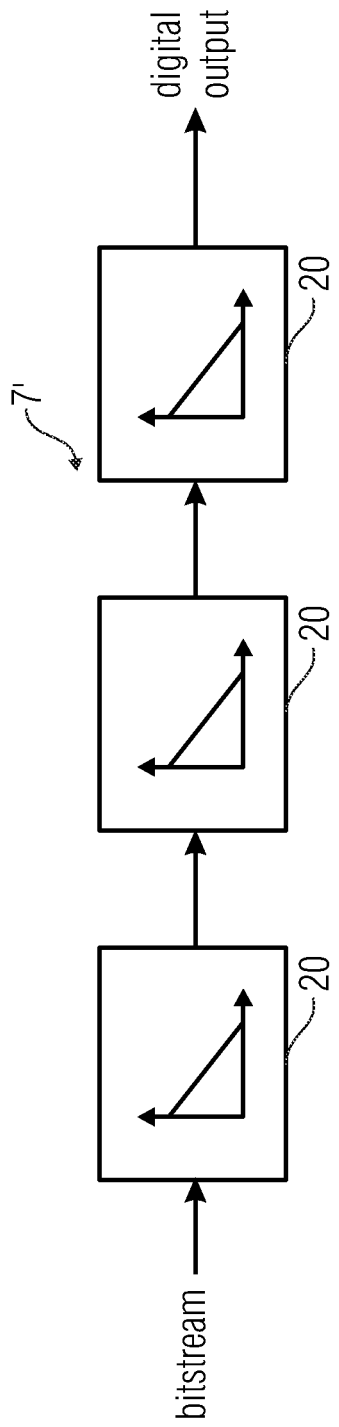
FIG. 2 shows a typical decimation filter for a $3^{rd}$-order IDSM.

FIG. 2 shows a possible filter 7 which may be employed at the output of the IDSM 1, namely a decimation filter 7'. An advantage of IDSM 1 as compared to DSMs is the possibility of being able to employ the simpler digital decimation filter 7' for processing the bitstream. A typical decimation filter 7' for a $3^{rd}$-order IDSM consists of three digital integrators 20, as shown in FIG. 2. The number of integrators 20 determines the order of the filter 7, 7'. The integrators 20 may be implemented as summators. As with the analog part of the IDSM 1, the summators are reset after each AD conversion is completed. The digital output Out of the decimation filter 7' is calculated as Out=ΣΣΣBit$_N$. By way of substitution, the three integrators 20 may also be replaced by using a look-up table (LUT) and one single summator since the influence of each bit on the digital output signal may be pre-calculated.

FIG. 3 shows a typical output signal with an associated variance when using a known circuitry 10 for an IDSM 1 comprising a known sample-and-hold element 9. A known disadvantage of DSMs and also of IDSMs is that when an input signal is present in the vicinity of the so-called full-scale value, increased noise occurs in the digital output signal. The full-scale value corresponds to a maximally possible resetting voltage. FIG. 3a shows the relationship between a normalized input signal and a normalized output value (output), and FIG. 3b shows the relationship between a normalized input signal and the variance of the digital output signal (of FIG. 3a) with a $3^{rd}$-order IDSM. On the x axes of FIGS. 3a, b, a maximum positive input signal adopts the value of +1, and a maximum negative input signal adopts the value of −1. (On the y axis of FIG. 3a, a normalized output signal is presented, while on the y axis of FIG. 3b, the variance of the output signal (output) is depicted with manifold conversion of the same value. The variance is also shown to be normalized.

One can see that with high input signals, i.e. with a maximum positive voltage and with a minimum negative voltage, a clear increase in the variance occurs. The variance indicates the fluctuation of the output value with various AD conversions at a same, i.e. constant, input value. However, this is problematic in case a signal and an associated reference signal are to be converted, which is also referred to as double sampling. The reference signal typically is located in the vicinity of the full-scale signal, and the actual signal is typically more positive than the reference signal (unipolar measurement). In this case, the overall noise of the calculated end signal would typically be dominated by the noise of the reference signal, even if the signal lies within the medium range of the IDSM 1 and if a small noise contribution might be achieved there. This results in that a large range of the input signal range (approx. 40-50%) cannot be employed in a useful manner due to the high level of noise.

FIG. 4 shows the known temporal progress of an (output) bitstream with an input signal having 90% full scale (FS), i.e. with an input voltage of 90% of the maximally possible resetting voltage. Normally, the bitstream of a DSM and/or a IDSM 1 exhibits a quasi-random behavior. Said random behavior is the basis for interpreting and calculating the behavior of the DSM. With input signals located in the vicinity of the full-scale value, this random behavior no longer occurs. By way of example, FIG. 4 shows an output bitstream with an input signal having 90% FS. Almost all output bits here are at one value, namely 1.

Figure 5:
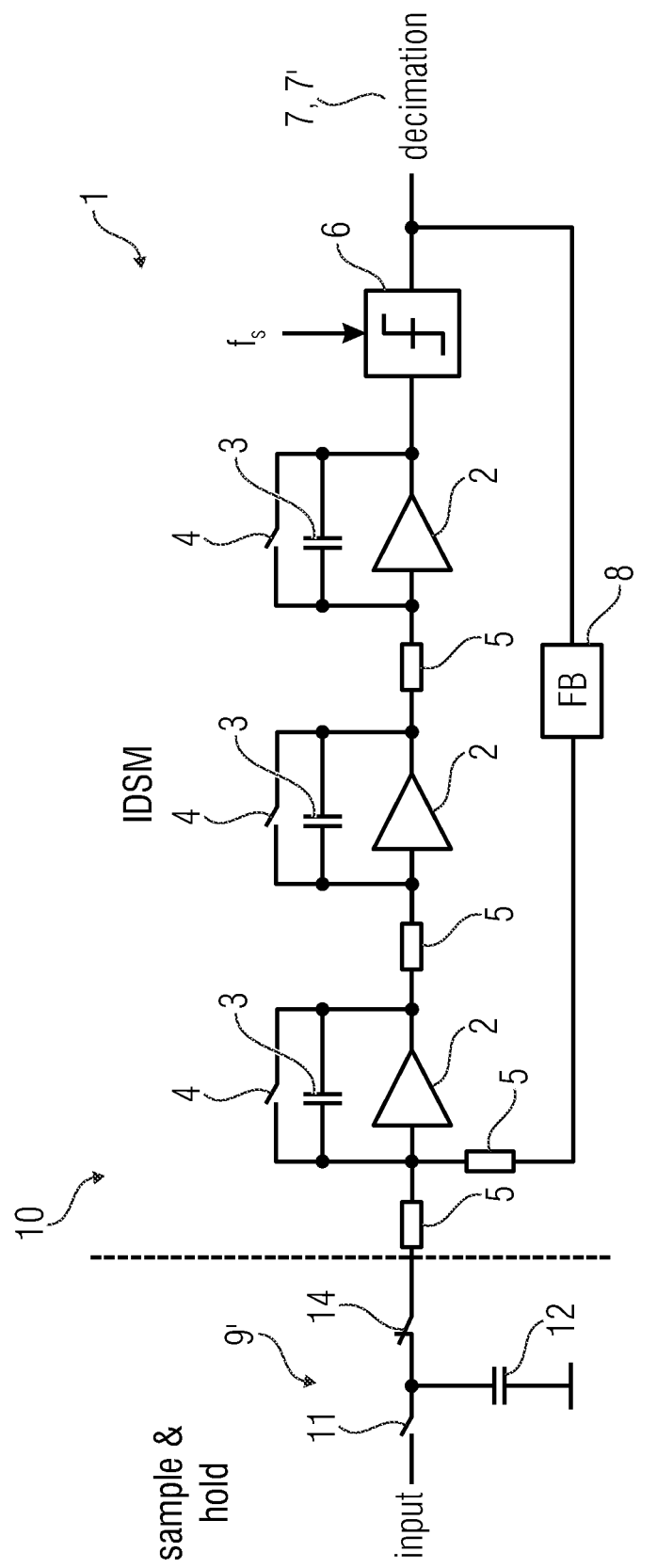
FIG. 5 shows an IDSM with a proposed passive sample-and-hold stage.
Figure 6:
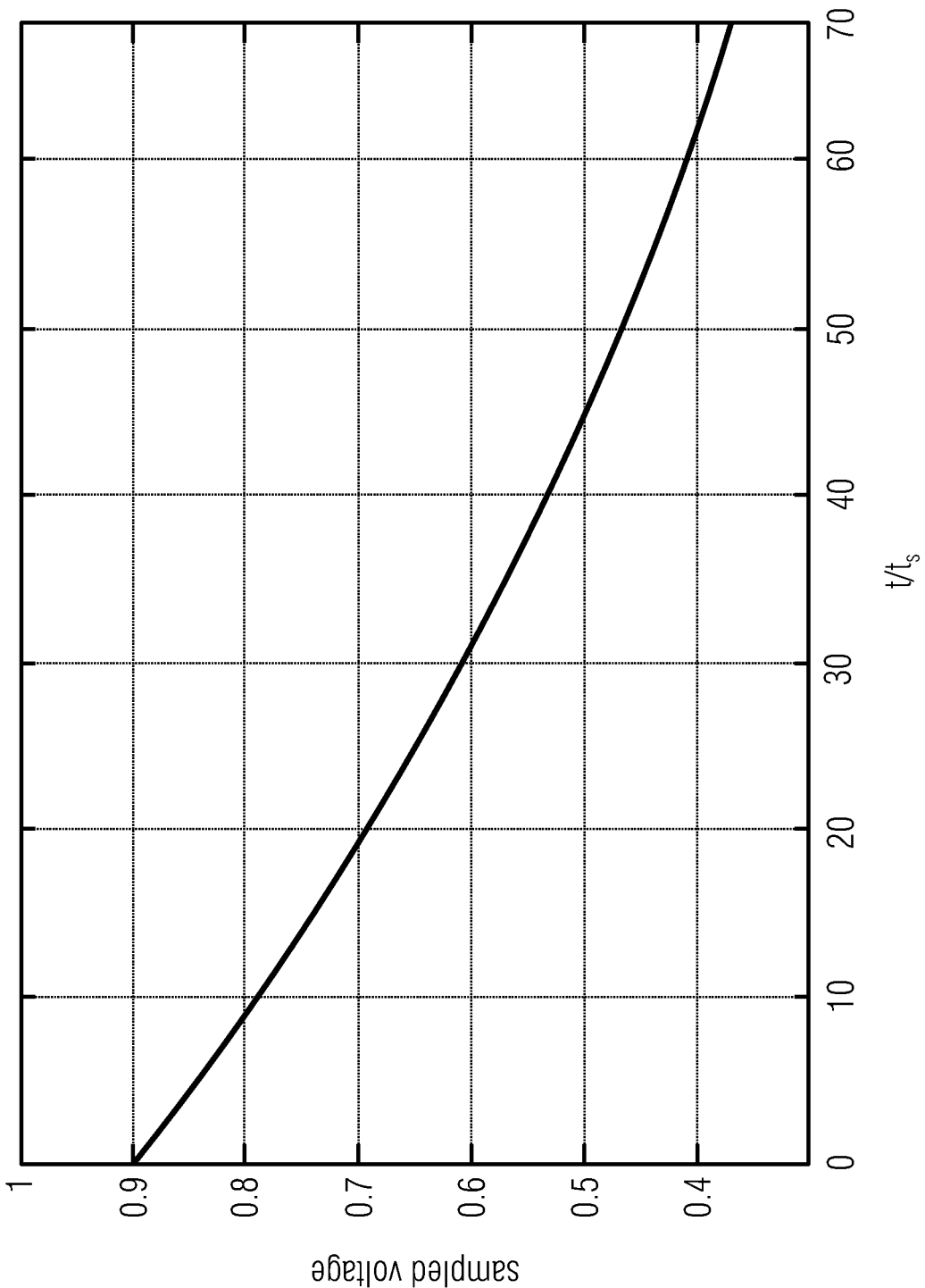
FIG. 6 shows the progress of the sampled voltage during an AD conversion with an input signal with 90% FS and a passive sample-and-hold stage in accordance with FIG. 5.

FIG. 5 shows an embodiment of a circuitry 10 in accordance with the proposal for an incremental delta-sigma modulator 1. So as to ensure the quasi-random behavior of the output bitstream even with input signals located in the vicinity of FS, a decaying input signal (a decaying input voltage $U_{on}$ as shown in FIG. 6) is used. This is achieved by dispensing with the active buffer 13 (as compared to FIG. 1) between the sampling capacitor 12 and the input resistor 5 of the IDSM 1, as shown in FIG. 5. In accordance with the proposal, a switch 14 is integrated into the sample-and-hold element instead of an active buffer 13 (FIG. 1), so that the capacitor 12 will be arranged between the switches 11 and 14. According to the proposal, a passive sample-and-hold element 9' (FIG. 5) is used, instead of a known active sample-and-hold element 9 (FIG. 1), for supplying the IDSM 1 with an input voltage $U_{on}$. When using an active sample-and-hold element 9, the IDSM is supplied with a constant input voltage $U_{on}$, whereas the IDSM 1 is supplied with a temporally decaying input voltage $U_{on}$ in case a passive sample-and-hold element 9' in accordance with the proposal is used. The capacitor 12 is charged to the input voltage $U_{on}$ during the reset phase of the IDSM 1 and is connected to the input resistor 5 of the IDSM 1 during conversion. The sampling capacitor 12 advantageously is selected such that the time constant constituted by the sampling capacitor 12 and the input resistor 5 of the IDSM 1 corresponds to the conversion period duration T, in particular to the AD conversion duration, which is defined as the number of bits/clock frequency.

Figure 7:
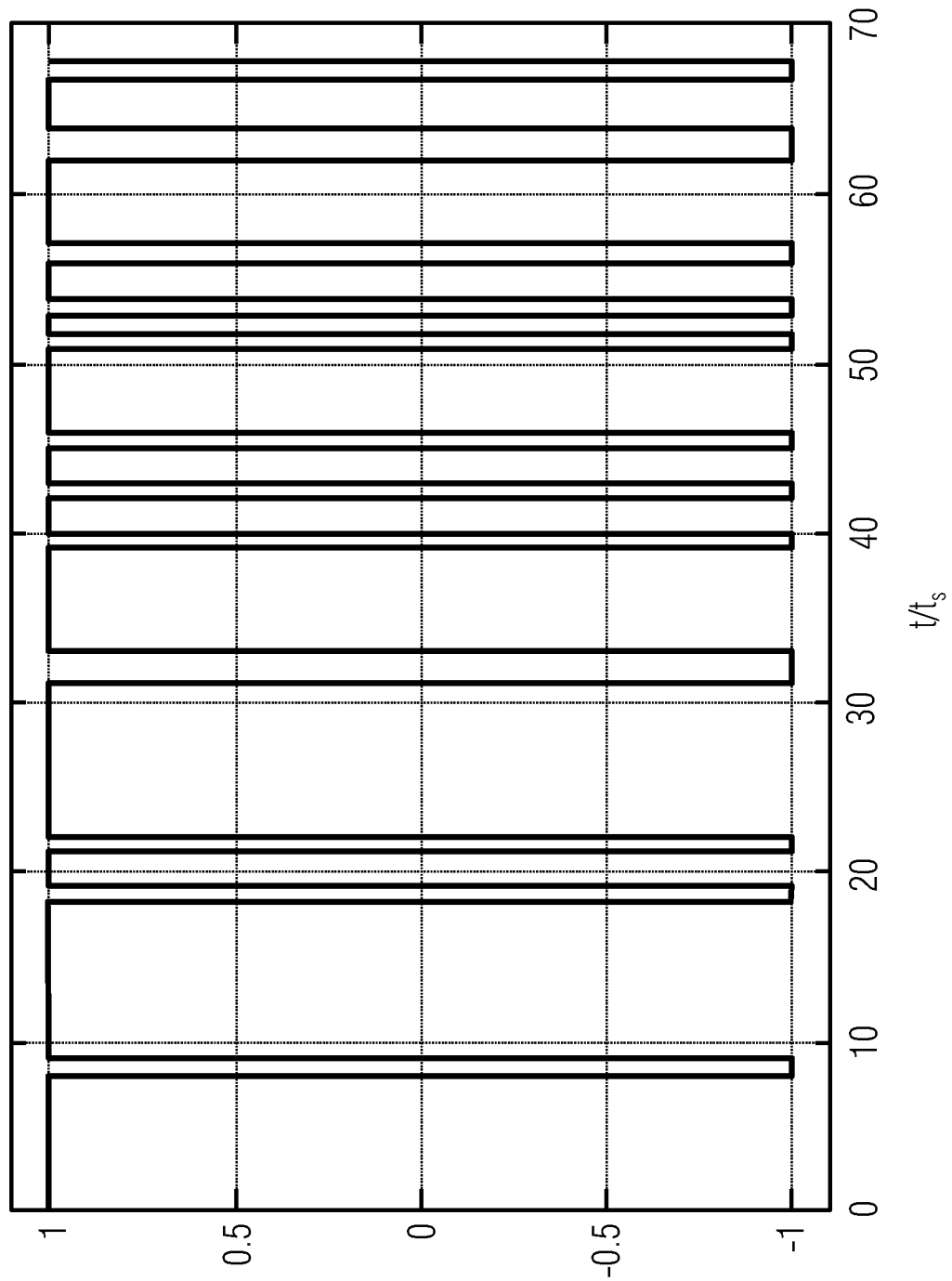
FIG. 7 shows an arising, quasi-random bitstream while using an IDSM in accordance with FIG. 5 and a voltage decreasing in amount in accordance with FIG. 6.

By discharging the capacitor 12 during the AD conversion, the voltage $U_{on}$ present on the capacitor 12 decreases from the sampled starting value, as shown in FIG. 6. Since the voltage $U_{on}$ present on the capacitor 12 decreases during the conversion, i.e. during the AD conversion, it is ensured that the arising bitstream of the IDSM 1 will again exhibit a quasi-random pattern after several clocks, as shown in FIG. 7.

Figure 8:
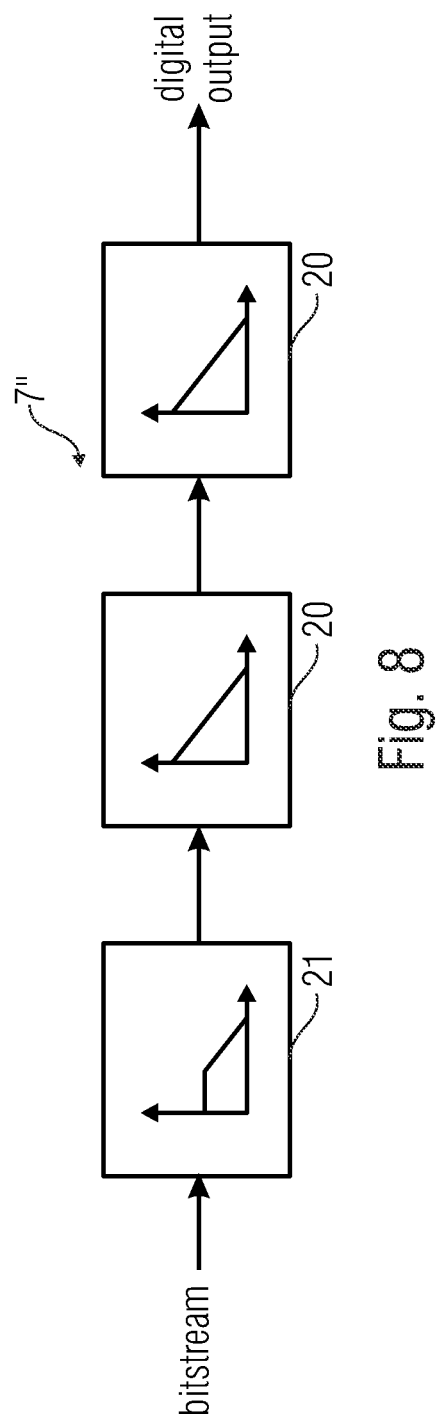
FIG. 8 shows a decimation filter with a lossy integrator for an IDSM having a passive sample-and-hold stage.

Due to the input signal $U_{on}$ of the IDSM 1, which is now temporally variable and is given by the decrease in the capacitor discharge, it is useful to adapt the weighting of the output bits within the decimation filter 7'. Due to the decreasing input signal $U_{on}$, the bits will involve, at the end of the AD conversion, an increased valency as compared to weighting in the event of a constant input signal $U_{on}$. As shown in FIG. 8, for the purpose of adapting the weighting, one of the integrators 20 of the decimation filter 7" (as compared to decimation filter 7' of FIG. 2) is replaced by a "lossy integrator" 21. The edge frequency of the "lossy integrator" 21 here is advantageously defined by the time constant constituted by the input resistor 5 and the sampling capacitor 12, namely by $f_C=1/(2\pi RC)$. One may freely select which of the integrators 20 will be replaced. As with the decimation filter 7' of FIG. 2, calculation of the digital output value as a weighted sum of the bitstream is also possible with the decimation filter 7" of FIG. 8.

Figure 9:
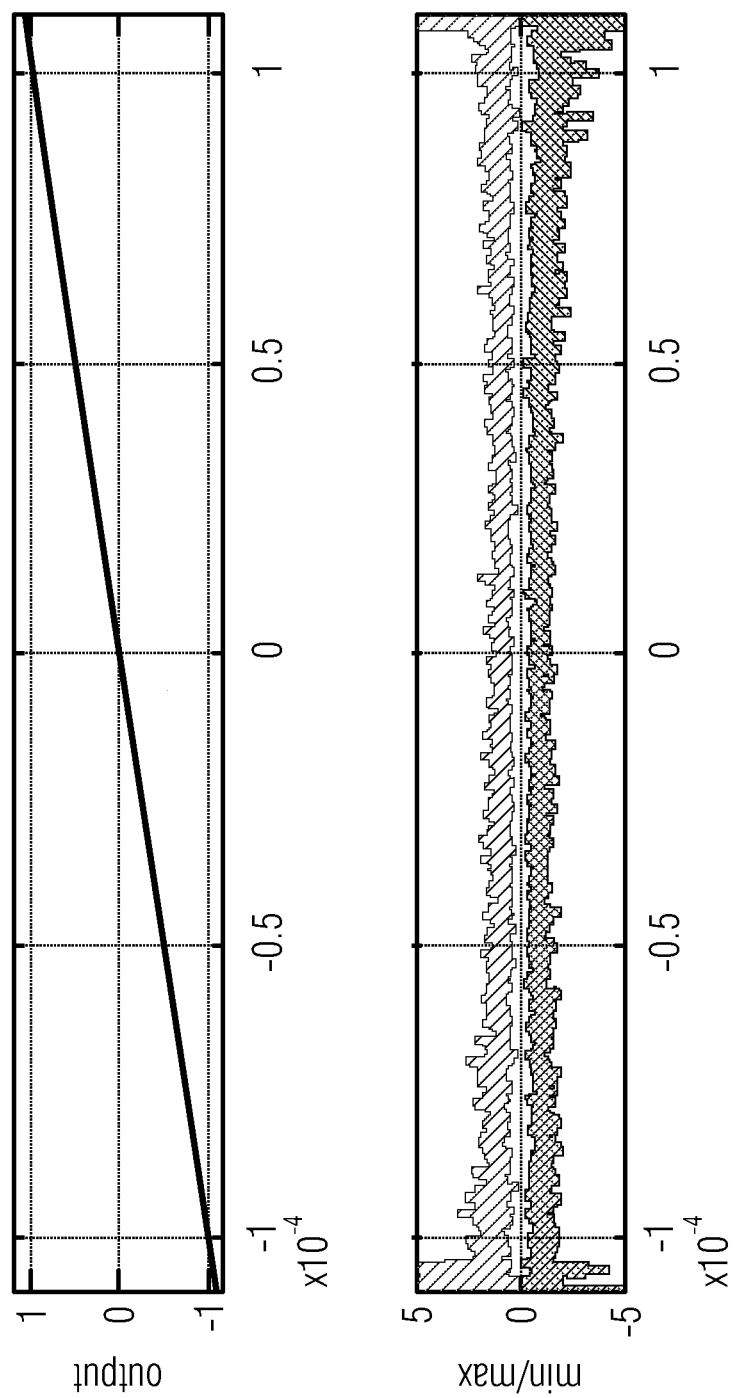
FIG. 9 shows an output signal and a variance with different input signals while using an inventive passive sample-and-hold stage.

When using a passive sample-and-hold element 9', or a passive S&H stage 9', as well as, in particular, when adapting the decimation filter 7", one achieves a clear improvement in the variance of the digital output value in the vicinity of FS. FIG. 9 shows the variance of the digital output value when using a passive sample-and-hold element 9', or a passive S&H stage 9'. The reduced variance with input values in the vicinity of the FS value enables using the entire input range. Due to the larger usable range, over-dimensioning of the IDSM, which might otherwise be performed, can be avoided. In addition, improved optimization of the analog circuit components with regard to thermal noise and power consumption is possible. Moreover, both power and circuit area as well as development time can be saved as a result of the active buffer 13 being dispensed with.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Circuitry for an incremental delta-sigma modulator, the circuitry comprises at least an incremental delta-sigma modulator and a sample-and-hold element, the sample-and-hold element being arranged in front of the incremental delta-sigma modulator and providing an input voltage for the incremental delta-sigma modulator in a charged state, wherein the sample-and-hold element comprises a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element, wherein the capacitor is configured such that a time constant for discharging the capacitor of the sample-and-hold element corresponds to an AD conversion.

2. Circuitry as claimed in claim 1, wherein the incremental delta-sigma modulator may be reset after each AD conversion.

3. Circuitry as claimed in claim 1, wherein the incremental delta-sigma modulator is an $n^{th}$-order modulator, wherein n is a natural number, in particular n=1, 2, 3, 4, 5, or 6.

4. Circuitry as claimed in claim 1, wherein the sample-and-hold element is integrated in the incremental delta-sigma modulator or may be externally connected to the incremental delta-sigma modulator.

5. Circuitry as claimed in claim 1, wherein the incremental delta-sigma modulator comprises, in particular at its output, a decimation filter, wherein weighting of output bits within the decimation filter is adaptable because the input voltage decreases in amount.

6. Circuitry as claimed in claim 5, wherein the output bits exhibit, at the end of the AD conversion, a valency that is increased as compared to the weighting in case of a static input voltage that is present at the incremental delta-sigma modulator.

7. Circuitry as claimed in claim 5, wherein, for adapting weighting, an integrator of a decimation filter of the delta-sigma modulator is replaced by a so-called lossy integrator, wherein, in particular, an edge frequency $f_C=1/(2\pi RC)$ is defined by a time constant constituted by the input resistor R and by the capacitor C.

8. Method of operating a circuitry comprising at least an incremental delta-sigma modulator and a, in particular passive, sample-and-hold element, wherein the sample-and-hold element is arranged in front of an input of the incremental delta-sigma modulator; in particular, the circuitry being configured for an incremental delta-sigma modulator, the circuitry comprises at least an incremental delta-sigma modulator and a sample-and-hold element, the sample-and-hold element being arranged in front of the incremental delta-sigma modulator and providing an input voltage for the incremental delta-sigma modulator in a charged state, wherein the sample-and-hold element comprises a capacitor for charging the input voltage for the incremental delta-sigma modulator, wherein a first switch is arranged in front of the capacitor, and a second switch is arranged behind the capacitor, wherein the first switch is open when the second switch is closed so as to provide, at the incremental delta-sigma modulator, an input voltage decreasing in amount, in particular a decaying input voltage, or wherein the second switch is open when the first switch is closed so as to charge the capacitor of the sample-and-hold element, the method comprising:
  providing an input voltage at the incremental delta-sigma modulator, in particular by the capacitor of the sample-and-hold element,
  using an input voltage decreasing in amount so as to ensure random behavior of an output bitstream, wherein
  the capacitor is charged during a resetting phase of the delta-sigma modulator and is connected to the delta-sigma modulator during a conversion;
  wherein the capacitor of the sample-and-hold element is selected such that a time constant for discharging the capacitor of the sample-and-hold element corresponds to a duration of an AD conversion.

9. Method as claimed in claim 8, wherein weighting of the output bits is adapted by means of a decimation filter; in particular, a valency that is increased as compared to weighting performed in the event of a constant input voltage is assigned to output bits at the end of an AD conversion.

10. Method as claimed in claim 8, wherein, for adapting weighting, an integrator of a decimation filter is replaced by a so-called lossy integrator, wherein, in particular, an edge frequency $f_C=1/(2\pi RC)$ is defined by a time constant constituted by the input resistor R and by the capacitor C.

11. Method as claimed in claim 8, wherein a digital output value is calculated as a weighted sum of the output bitstream.

* * * * *